(12) United States Patent
Li

(10) Patent No.: US 7,161,401 B2
(45) Date of Patent: Jan. 9, 2007

(54) WIDE OUTPUT-RANGE CHARGE PUMP WITH ACTIVE BIASING CURRENT

(75) Inventor: Ning Li, Fremont, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/787,954

(22) Filed: Feb. 27, 2004

(65) Prior Publication Data

US 2005/0189973 A1  Sep. 1, 2005

(51) Int. Cl.
H03L 7/06 (2006.01)
(52) U.S. Cl. ..................................... 327/157
(58) Field of Classification Search ........ 327/156–147, 327/157
See application file for complete search history.

(56) References Cited

U.S. PATENT DOCUMENTS

| | | | | |
|---|---|---|---|---|
| 6,181,210 B1* | 1/2001 | Wakayama | ................ | 331/8 |
| 6,326,852 B1 | 12/2001 | Wakayama | ................ | 331/17 |
| 6,526,111 B1* | 2/2003 | Prasad | ................ | 375/376 |
| 6,727,736 B1* | 4/2004 | Tsang et al. | ................ | 327/157 |
| 6,771,114 B1* | 8/2004 | Watarai | ................ | 327/536 |
| 2004/0004500 A1* | 1/2004 | Byun et al. | ................ | 327/156 |
| 2004/0085106 A1* | 5/2004 | Jeong | ................ | 327/157 |
| 2004/0257162 A1* | 12/2004 | Mokeddem | ................ | 331/16 |

* cited by examiner

Primary Examiner—Quan Tra
(74) Attorney, Agent, or Firm—Sterne, Kessler, Goldstein & Fox, P.L.L.C.

(57) ABSTRACT

A charge pump circuit includes a charge pump having an output voltage. A replica circuit actively matches up and down currents in the charge pump. A charge pump bias current transistor biases the charge pump. The charge pump includes four switches driven by differential UP and DOWN signals. The charge pump includes a first tail current source connected between a supply voltage and two of the four switches that are driven by the differential UP signal, and a second tail current source connected between a supply voltage and two of the four switches that are driven by the differential DOWN signal. The charge pump includes an operational amplifier whose output is connected to an output of one of the tail current sources. A dump capacitor is connected to a negative input of the operational amplifier. The replica circuit includes four transistors, two of which match the first and second tail current sources, and the other two match the switches driven by the differential UP and DOWN signals. The replica circuit includes a second operational amplifier that matches the charge up and down current for varied output voltage. A low pass filter is at the output voltage and includes a resistor-capacitor network.

16 Claims, 2 Drawing Sheets

WIDE OUTPUT-RANGE CHARGE PUMP WITH ACTIVE BIASING CURRENT

BACKGROUND OF THE INVENTION

1. Field of the Invention

The present invention relates generally to charge pumps, and more particularly, to charge pumps used in phase locked loops.

2. Background Art

Phase locking was invented in the 1930s, and is widely used in the electronics and communication systems. A Phase Locked Loop (PLL) can be used to synthesize new clocks by multiplication from input frequency. A PLL can also be used to suppress fast jitter, or to reduce timing skew between data and clock.

In recent years, with the development of VLSI technologies, PLLs have finally been integrated on a chip without external components. This significantly reduces their cost, and enables more applications with enhanced performance and more features.

For PLLs, jitter is an important parameter. It is observed at the crossing point of the clock waveform. Jitter is the time difference by which the PLL deviates from an ideal crossing point. Low-jitter PLLs are especially important in high-speed digital communication chips, where timing of the data transfer is critical.

FIG. 1 illustrates a conventional tri-state charge pump, coupled to receive differential UP and DOWN signals from a phase detector (not shown). The charge pump is implemented as two switched current sources 30 and 32 driving a capacitor 34. FET switches 36, 38, 40, 42 and an operational transconductance amplifier (OTA) 39 are connected as shown, driven by differential UP/DOWN signals. An output voltage Vc controls the oscillation frequency of a voltage controlled oscillator (VCO) of the PLL. The UP/DOWN signals represent feedback to either increase or decrease the VCO frequency by either charging or discharging the capacitor 34.

Although a transistor operating in the saturation region has good output impedance, it is not infinite. The current sources 30, 32 with finite output impedances are not desirable. The result is that the charge up and down current depends on the output voltage Vc. This relationship can be approximated by delta(Ids)=delta(Vds)/$R_{OUT}$, where delta(Vds) is the small change at the drain-to-source voltage of a transistor, delta(Ids) is the drain current change due to the Vds drop, and $R_{OUT}$ is the output impedance. The output impedance ROUT can be in the range of a few megaohms, and it is significantly lower when the drain to source voltage (Vds) is low, where the transistor is close to a triode region.

For a charge pump to have a linear response, the charge up and down control signals (UP/DOWN) need to overlap for a short period of time to avoid a 'dead zone'. Otherwise, the charge pump would have a non-linear response when the PLL is near the lock condition. The charge is given by the current multiplied by time: $dQ=(I_{UP}*T_{UP}-I_{DOWN}*T_{DOWN})$. If $I_{UP}=I_{DOWN}$, $dQ=I_{UP}*(T_{UP}-T_{DOWN})$. By the overlapping the time, the dead zone problem is solved. Ideally $T_{UP}=T_{DOWN}$, thus $dQ=I_{UP}*(T_{UP}-T_{DOWN})=0$. That means there is no net charge delivered to the output node (Vc).

The charge pump is thus an important component in a charge pump PLL. The output of the charge pump usually directly controls the VCO. Therefore, any non-idealities in the charge pump due to $I_{UP}/I_{DOWN}$ imbalance result in jitter in the PLL.

One of these non-idealities is DC offset, which occurs when the charge pump has unbalanced up and down currents $I_{UP}/I_{DOWN}$. Due to the unbalance, the charge injected to the output is given by the equation: $dQ=(I_{UP}*T_{UP}-I_{DOWN}*T_{DOWN})$. When $T_{UP}=T_{DOWN}$, $dQ=(I_{UP}-I_{DOWN})*T_{UP}$, which is not zero, since $I_{UP}$ is not equal to $I_{DOWN}$. That means there is net charge delivered to the output node Vc.

With this DC offset, a PLL will still lock, but there is a phase difference between input and the feedback clock. Since the output of the charge pump controls the VCO, the output frequency gets periodically disturbed from compensating for the DC offset.

Another non-ideality of the charge pump is a transient glitch. Ideally, when up and down currents are equal, the output control voltage Vc should not change after PFD (phase frequency detector) updating. However, although the overall average voltage does not change, it can cause a transient disturbance. Since this voltage controls the frequency (or phase) of the PLL output, the output frequency will change according to $f_{vco}=K_{VCO}*Vc$, where $K_{VCO}$ is the gain of the VCO, which is defined as $K_{VCO}=d(fout)/d(Vc)$. A charge pump without a good transient response will have poor spur performance, which presents a problem in communication systems.

It is desirable to have a wide operating range of the charge pump. In silicon wafer processing, due to random manufacturing conditions, devices will have process corners known as typical, slow, and fast, for both NMOS and PMOS devices. For resistors, there is a typical resistor, a low resistor, and a high resistor corners. When integrated circuits (IC) are placed in an application, the supply voltage can vary by a certain percentage. Also, environment temperature can change. Typically, a solid state design needs to pass all potential process, voltage, and temperature (PVT) corners to operate reliably in the field.

For the charge pump, a wide operation range also means a wide tuning range. The tuning range is the possible frequencies that a PLL can cover at all PVT corners. At the PVT corners, the control voltage of PLL needs to adjust to lock to a proper value so that the PLL remains locked. Ideally the control voltage should go from near ground to supply voltage Vdd.

What is needed, therefore, is a charge pump that allows the PLL to operate over a wider range without introducing non-linearity effects.

BRIEF SUMMARY OF THE INVENTION

Accordingly, the present invention is directed to a wide output-range charge pump with active biasing current that substantially obviates one or more of the problems and disadvantages of the related art.

There is provided a charge pump circuit includes a charge pump having an output voltage. A replica circuit actively matches up and down currents in the charge pump to provide good jitter performance in a PLL. A charge pump bias current transistor biases the charge pump. The charge pump includes four transistors driven by differential UP and DOWN signals. The charge pump includes a first tail current source connected between a supply voltage and two of the four transistors that are driven by the differential UP signal, and a second tail current source connected between a supply voltage and the other two of the four transistors that are driven by the differential DOWN signal. The charge pump includes an operational amplifier whose output is connected to an output of one of the tail current sources. A dump capacitor is connected to a negative input of the operational amplifier. The replica circuit also includes four transistors, two matching the first and second tail current sources, and the other two matching the switches driven by the differential UP and DOWN signal. The replica circuit includes a second operational amplifier that actively matches the up and down current. A low pass filter is at the output voltage and includes a resistor-capacitor network.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

A charge pump with actively matched up and down currents $I_{UP}$, $I_{DOWN}$ is described herein. An opamp and a replica circuit are applied to form a feedback loop to track the charge pump output voltage. With this feedback loop, the charge pump provides a low DC offset and an optimal transient response for a wide output range resulting in good jitter performance in a PLL. With the matching of up and down currents $I_{UP}$, $I_{DOWN}$, an output (pole) capacitor of the charge pump is charged and discharged identically.

Figure 2:
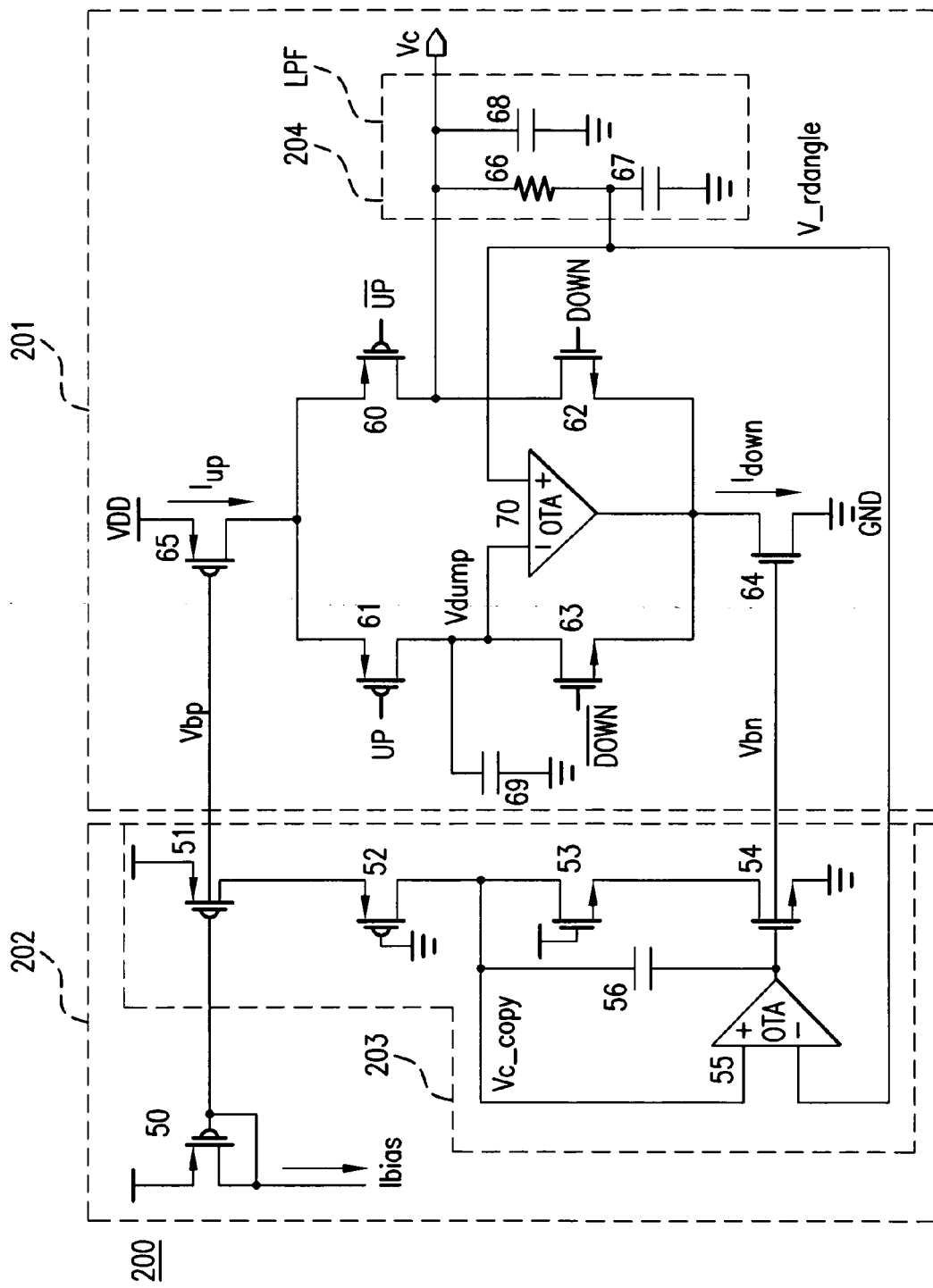
FIG. 2 illustrates a charge pump circuit with a replica circuit for current matching, as used in the present invention.

FIG. 2 illustrates one embodiment of a charge pump circuit 200 of the present invention. It includes a bias replica circuit 202, including transistors 51, 52, 53, 54, an operational transconductance amplifier (OTA) 55 and a capacitor 56. An optional bias transistor 50 can be used to control voltage at a gate of the transistor 51. A charge pump 201 includes transistors 60, 61, 62, 63, tail current sources 64, 65, a low pass filter (LPF) 204 formed by capacitors 67, 68, and resistor 66. The LPF 204 is connected to an OTA 70 in a feedback path.

The charge pump bias current (not designated in FIG. 2) is determined by the $I_{BIAS}$ from a diode-connected PMOS transistor 50. This diode-connected PMOS transistor 50 generates a voltage Vbp for the transistors 51 and 65. A "dump" capacitor 69 (typically 2–20 pF) is used to compensate a feedback loop formed by OTA 70 and transistor 63. This capacitor 69 also holds the dump node voltage Vdump when the charge pump 201 is in the charge up or charge down states (i.e., charging or discharging the capacitors 67, and 68).

Transistors 51, 52, 53, 54 are the bias replica of the charge pump 201. Therefore, they should preferably have the same sizes as corresponding transistors in the charge pump 201 (i.e., transistors 65, 61, 63 and 64).

The OTA 55, and the bias replica transistors 51–54 form a feedback loop to track the output voltage Vc. The OTA 55 output drives a gate of the NMOS transistor 54 as well as a gate of transistor 64. The positive input of the OTA 55 is connected to drains of the devices 52 and 53, while the negative input of the OTA 55 is connected to the node V_rdangle in the LPF 204. This forces Vc_copy node to track the output voltage Vc. A capacitor 56 is used to compensate the two-stage amplifier formed by the OTA 55 and the bias replica transistors 51–54.

The low pass filter (LPF) 204 is connected to the output Vc of the charge pump 201 to transfer the charge into a voltage. The low pass filter 204 includes the "zero" resistor 66, the "zero capacitor" 67 (typically about 10–500 pF), and the "pole capacitor" 68 (typically about 1–25 pF). The LPF 204 provides compensation for the PLL loop (that includes a VCO, not shown, and the feedback signals UP/DOWN) and suppression to the transient response on the control voltage Vc. Vc controls the VCO.

Because the PMOS transistors 51 and 65, and the NMOS transistors 54 and 64 are identical, the bias current IBIAS is copied from the replica bias circuit 202 to the charge pump 201. When Vc changes, the bias replica current will vary, but the feedback circuit will control Vbn so that charge down will be automatically matched.

The charge pump transistors (switches) 60, 61, 62 and 63 control the direction of current flow in the charge pump 201. The second OTA 70 has a positive input connected to the node 'V_rdangle' of the zero capacitor 67, a negative input connected to the 'Vdump' node, and an output connected to the the drain of the NMOS tail current transistor 64. The OTA 70 keeps the Vdump node the same potential as the VCO control voltage Vc. The OTA 70 also further reduces the mismatch of charge up and charge down currents $I_{UP}$/$I_{DOWN}$, which is caused by the device mismatches between the replica circuit transistors 51, 54 and the tail current transistors 65, 64. The output of the OTA 70 can be connected either to the drain of the NMOS transistor 64, or to the drain of the PMOS transistor 65.

Thus, a replica bias circuit 202 and a feedback loop are used to track the output control voltage Vc. Therefore, when the output control voltage Vc changes, the feedback follows quickly until the PLL is in lock.

Figure 1:
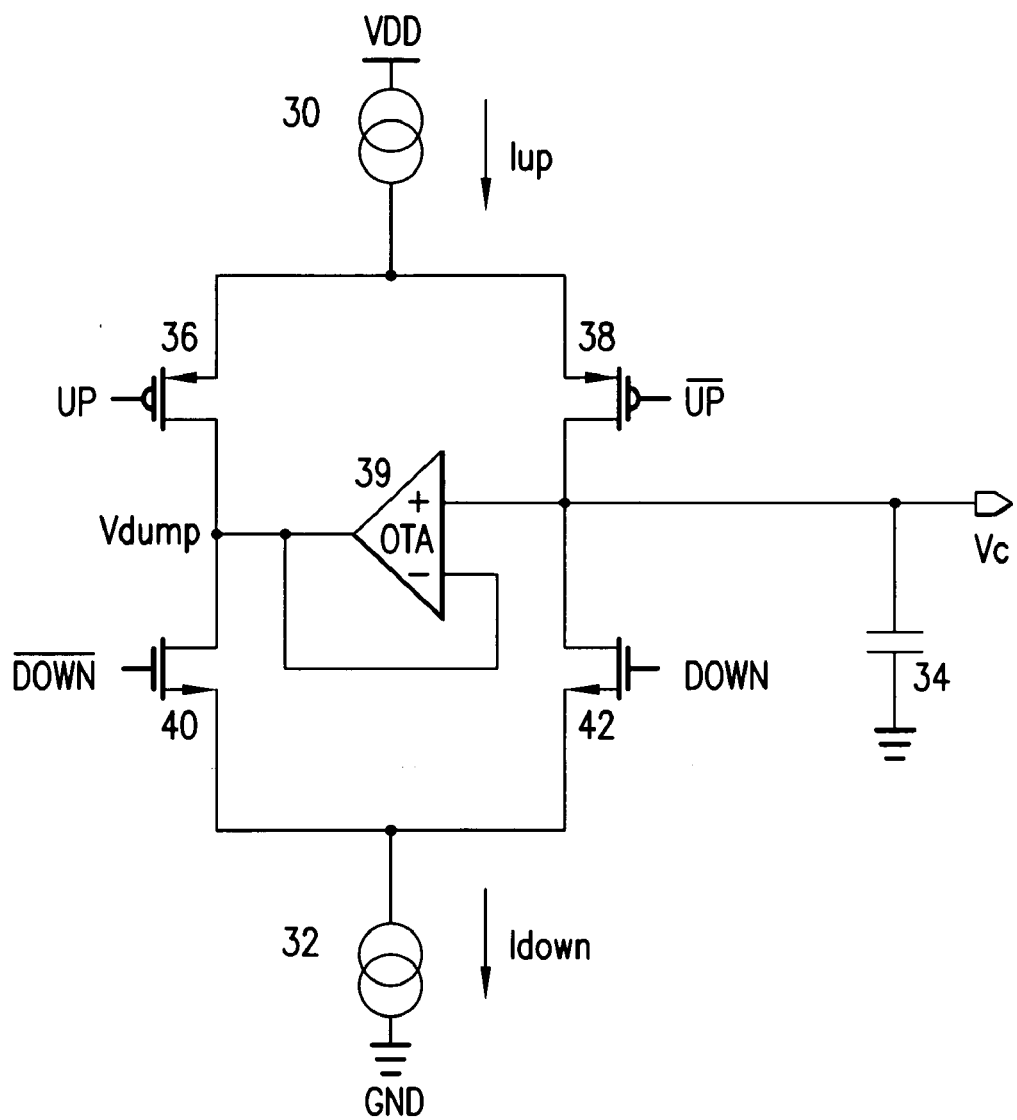
FIG. 1 illustrates a conventional charge pump circuit.

Active DC offset correction is achieved with the circuit of the present invention. In a conventional charge pump, when Vc drops by dV, the current provided by the PMOS transistor (see FIG. 1) will increase by $dV/R_{OUT}(p)$, and the current provided by the NMOS transistor (see FIG. 1) decreases by $dV/R_{OUT}(n)$. The charge pump mismatch current is given by $dV/R_{OUT}(P)+dV/R_{OUT}(n)$. This offset current varies with PVT corners. When the charge pump current has DC offset, it requires a PLL to have an error phase to correct this constant difference. The charge pump circuit 200 of FIG. 2 actively corrects the DC offset.

Dynamic transient response is also improved. Ideally, when charge up and charge down currents ($I_{UP}$, $I_{DOWN}$) are equal, the output control voltage Vc should not change. A DC-balanced charge pump, without active current matching, could still have poor transient response. That means that although the overall average voltage is not changed at control voltage node Vc, it can still cause a transient disturbance. Since the control voltage Vc controls the phase of the output waveform, the output frequency can get a periodical hit at frequency of the input reference. In the conventional charge pump, the charge pump is not DC balanced, and thus it has a greater transient disturbance. This problem is avoided in the circuit 200 of FIG. 2.

Output range is also improved. With active current matching, the charge pump tracks the output voltage Vc to match the up and down current $I_{UP}$, $I_{DOWN}$. Wide output range can be applied to extend the VCO tuning range, or to reduce the $K_{VCO}$ for the same tuning range.

In an alternative embodiment, the OTA 55 can control the top tail current source (i.e., transistor 65), while the bottom current $I_{DOWN}$ is provided by a current source.

In another alternative embodiment, transistors 54, 64, and other the NMOS can be bipolar transistors. They can also be source de-generated. In another alternative embodiment, transistors 50, 51 and 65 can be source degenerated, or they can be bipolar. Both PMOS and NMOS transistors 54, 64 can be used, as well as bipolar transistors. These can be source de-generated NMOS or PMOS transistors as well.

In another alternative embodiment, replica transistors 52, 53 can be removed or replaced with other devices, such as resistors. In another alternative embodiment, 60, 61, 62 and 63 can be other types of devices, in addition to PMOS or NMOS transistors, e.g., CMOS (complimentary NMOS and PMOS) devices, or bipolar transistors.

In another alternative embodiment, although a Miller-type capacitor for the capacitor 56 is preferred, other compensation techniques can be applied. In another alternative embodiment, feedback points of V_rdangle can vary for OTA 55, however, the DC value is the same as Vc.

Here, the active current matching is applied to a charge pump, where matching of the up current $I_{UP}$ and down current $I_{DOWN}$ is important, and matching should be done over a wide range of output voltage.

The charge pump 201 is not limited to the illustrated arrangement, as long as the replica and active biasing circuit is present to reduce the $I_{UP}/I_{DOWN}$ mismatch.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A charge pump circuit comprising:
   a charge pump having a charge pump output;
   wherein the charge pump includes a first switch driven by a differential UP signal coupled to a second switch driven by a differential DOWN signal;
   wherein the charge pump includes a first tail current source coupled between a supply voltage and the first switch, and wherein a second tail current source is coupled between a ground and the second switch;
   wherein the charge pump includes an operational amplifier having an amplifier output and an amplifier input, wherein the amplifier output is coupled to one of the first tail current source and the second tail current source;
   a low pass filter coupled to the charge pump output, wherein the low pass filter includes a resistor-capacitor network and wherein an output between a resistor and a capacitor of the resistor-capacitor network is coupled to the amplifier input; and
   a replica circuit that adjusts the first tail current source and the second tail current source in the charge pump, wherein the output between the resistor and the capacitor of the resistor-capacitor network provides feedback to the replica circuit.

2. The charge pump circuit of claim 1, further including a dump capacitor connected to a second input of the operational amplifier.

3. The charge pump circuit of claim 1, wherein the replica circuit includes four transistors, two of the four transistors matching the first tail current source and the second tail current source, and the other two of the four transistors matching the first switch and the second switch.

4. The charge pump circuit of claim 1, wherein the replica circuit includes a second operational amplifier that actively follows an output voltage of the charge pump circuit, and adjusts at least one of the first tail current source and the second tail current source.

5. The charge pump circuit of claim 1, further including a charge pump bias current transistor for biasing the charge pump.

6. A charge pump circuit comprising:
   a first tail current source and a second tail current source connected to a supply voltage and a ground voltage, respectively;
   two UP current switches connected to the first tail current source and passing an UP current to a pole capacitor in response to a differential UP signal;
   two DOWN current switches connected to the second tail current source and passing a DOWN current to the pole capacitor in response to a differential DOWN signal;
   a first amplifier having a negative input and a positive input for correcting mismatch in currents through the first and the second tail current sources and whose output is connected to one of a drain output of the first tail current source and a drain output of the second tail current source;
   wherein at least one of an UP current switch and a DOWN current switch is coupled between the first amplifier output and the negative input;
   wherein at least one of an UP current switch and a DOWN current switch is coupled between the first amplifier output and the positive input;
   a replica circuit including:
      a first mirror transistor and a second mirror transistor whose gates are driven by the same voltage as the first and the second tail current sources, respectively, and
      a two stage amplifier comprising a first replica transistor matching one of the two UP switches, and a second replica transistor matching one of the two DOWN switches, and an operational amplifiers,
      wherein the two stage amplifier and the first and second mirror transistors actively adjust the UP and DOWN currents; and
   a low-pass filter coupled to a charge pump output, wherein the low pass filter includes a resistor-capacitor network and wherein an output between a resistor and a capacitor of the resistor-capacitor network is coupled to the first amplifier positive input;
   wherein the output between the resistor and the capacitor of the resistor-capacitor network provides feedback to the replica circuit.

7. The charge pump circuit of claim 6, further including a dump capacitor connected to the negative input of the first amplifier.

8. The charge pump circuit of claim 6, further including a zero resistor and a zero capacitor connected in parallel with the pole capacitor.

9. The charge pump circuit of claim 6, further including an active biasing amplifier for correcting mismatch in currents through the first and second tail current sources.

10. The charge pump circuit of claim 9, further including a charge pump current control diode for biasing the first current source.

11. A charge pump comprising:
four switches driven by differential UP and DOWN signals;
a first tail current source connected between a supply voltage and two switches that are driven by the differential UP signal;
a second tail current source connected between a ground voltage and two switches that are driven by the differential DOWN signal;
an operational amplifier having a negative input and a positive input whose output is connected to one of a drain output of the first tail current source and a drain output of the second tail current source;
wherein a first switch driven of the four switches by one of a differential UP signal and a differential DOWN signal is coupled between the operational amplifier output and the negative input;
wherein a second switch of the four switches driven by one of a differential UP signal and a differential DOWN signal is coupled between the operational amplifier output and the positive input;
a low pass filter coupled to a charge pump output, wherein the low pass filter includes a resistor-capacitor network and wherein an output between a resistor and a capacitor of the resistor-capacitor network is coupled to the positive input; and
a replica circuit that adjusts the first tail current source and the second tail current source in the charge pump, wherein the output between the resistor and the capacitor of the resistor-capacitor network provides feedback to the replica circuit.

12. The charge pump of claim 11, further including a dump capacitor connected to the negative input of the operational amplifier.

13. The charge pump of claim 11, wherein the replica circuit includes four transistors, two of the four transistors matching the first and second tail current sources, and the other two of the four transistors matching the first and second switches driven by the differential UP and DOWN signals.

14. The charge pump circuit of claim 13, wherein the replica circuit includes a second operational amplifier that actively follows an output voltage from the charge pump, and adjusts one of the tail current sources so that up and down current mismatch is minimized.

15. The charge pump of claim 11, further including a charge pump bias current transistor for biasing the charge pump.

16. The charge pump of claim 11, wherein the replica circuit actively matches up and down currents in the charge pump.

* * * * *